United States Patent [19]
Beasom

[11] Patent Number: 5,306,944
[45] Date of Patent: Apr. 26, 1994

[54] SEMICONDUCTOR STRUCTURE WITHIN DI ISLANDS HAVING BOTTOM PROJECTION FOR CONTROLLING DEVICE CHARACTERISTICS

[75] Inventor: James D. Beasom, Melbourne Village, Fla.

[73] Assignee: Harris Corporation, Melbourne, Fla.

[21] Appl. No.: 651,327

[22] Filed: Feb. 5, 1991

Related U.S. Application Data

[63] Continuation of Ser. No. 470,197, Jan. 24, 1990, abandoned.

[51] Int. Cl.$^5$ ............... H01L 29/80; H01L 29/72; H01L 27/12
[52] U.S. Cl. ............... 257/524; 257/506; 257/517
[58] Field of Search ............ 357/22, 34, 49, 35; 257/501, 504, 524, 506, 517

[56] References Cited

U.S. PATENT DOCUMENTS

| | | | |
|---|---|---|---|
| 3,378,737 | 6/1965 | Welty | 357/22 |
| 4,602,419 | 7/1986 | Harrison et al. | 29/571 |

FOREIGN PATENT DOCUMENTS

| | | | |
|---|---|---|---|
| 1-115135 | 5/1989 | Japan | 357/49 |
| 1-169961 | 7/1989 | Japan | 357/34 |

OTHER PUBLICATIONS

Ziegler et al, 'Self Isolating Bathtub Collector . . . ', IBM Tech, vol. 14 #5, Oct. 1971, pp. 1635–1636.
Muller et al, *Device Electronics for ICs,* pp. 202–213, 1986.

*Primary Examiner*—Andrew J. James
*Assistant Examiner*—Stephen D. Meier
*Attorney, Agent, or Firm*—Charles E. Wands

[57] ABSTRACT

The thickness of a DI island structure is reduced and the performance of bipolar and JFET structures enhanced by shaping the bottom of the DI island during anisotropic etching to define isolated islands, so that the resulting structure contains one or more projections whose separation from the topside diffusion predefines operational characteristics of the device. If the projection is directly beneath the bottom of a gate diffusion, pinch-off voltage of a JFET device is reduced without substantially affecting channel resistance. When the projection is positioned so that its inclined surface extends alongside the curvilinear PN junction formed between the gate diffusion and the island, channel thickness and sensitivity of channel thickness to viriations in island thickness are reduced. To enhance BVCEO in DI structures, the inverted V-shaped projection extends alongside, but is spaced-apart from, a deep base diffusion, so that the base-collector PN junction is spaced-apart from the projection, such that that portion of the island layer between the base-collector PN junction and the projection becomes completely depleted of carriers prior to the magnitude of the electric field required for collector-emitter breakdown being reached in the course of an increase in collector-to-emitter voltage. The resistance of an island resistance device can be increased by forming one or more projections across the bottom of the island layer, which effectively increases the resistance at those portions of the island layer between the vertex of each projection and the top surface of the island layer.

25 Claims, 4 Drawing Sheets

SEMICONDUCTOR STRUCTURE WITHIN DI ISLANDS HAVING BOTTOM PROJECTION FOR CONTROLLING DEVICE CHARACTERISTICS

This is a continuation of application Ser. No. 470,197, filed Jan. 24, 1990, now abandoned.

FIELD OF THE INVENTION

The present invention relates in general to semiconductor devices and is particularly directed to a dielectrically isolated island architecture in which the bottom of the island is contoured upwardly to form one or more projections for the purpose of controllably tailoring the operational characteristics of a device, such as a bipolar or junction field effect transistor.

BACKGROUND OF THE INVENTION

Due to their complementary functionality, bipolar transistors and junction field effect transistors (JFETs) are often formed as part of the same integrated circuit. When the support architecture employs dielectrically isolated islands for device separation, it is common practice to form a JFET in the manner diagrammatically illustrated in FIG. 1, by using an island layer 11, which is dielectrically isolated from a surrounding substrate 13 by means of an insulator layer (e.g. oxide) 12, as a channel region 16, and a diffusion region 17 as a topside junction gate. High impurity concentration regions 18 and 20 form respective source and drain contacts for the island. The bottom 21 of channel region 16 is bounded by isolation oxide 12, with substrate 13 therebeneath acting as a bottom gate. If complete saturation of the drain characteristic or pinch-off is desired, substrate 13 must be biased at a voltage such that the topside junction gate region 17 is able to control the entire channel charge. Unfortunately, the structure of FIG. 1 suffers from several problems.

More particularly, in order to keep the pinch-off voltage $V_p$ low, it is necessary that the space or separation $x_d$ between the bottom of junction gate 17 and the bottom boundary 21 of the channel island 11 be kept small. Using a one-sided step junction model to define the pinch-off voltage, then $$V_p = x_d^2 q N_c / 2k \ldots \quad (1)$$

where:
$N_c$ = channel doping concentration
q = channel charge, and
k = dielectric constant of the semiconductor of the island.

Normally, the thickness required to achieve the desired pinch-off voltage is less than that required beneath a diffusion region of other operational purposes. Two conventional mechanisms for dealing with this problem involve the use of a special deep diffused region for the gate and the formation of special thinner islands by means of masked backside etching during the dielectric isolation fabrication process. However, each of these techniques requires an additional masking operation as well as other extra process steps, thus increasing manufacturing complexity and cost.

A second problem with the structure of FIG. 1 is the fact that channel thickness $x_d$ will vary as island thickness varies as a result of dielectric isolation fabrication process tolerances. This variation in channel thickness, in turn, leads to a large variation in pinch-off voltage, which is undesirable for most JFET circuit applications.

A third problem with the configuration of FIG. 1, which becomes especially severe when a high breakdown voltage is required, relates to control of the channel at the ends of the gate region adjacent to the dielectric sidewall boundaries of the island. As at the bottom of the channel, at the ends of the gate region there is an associated pinch-off voltage similarly defined by equation (1) above. To keep this pinch-off voltage n higher than the pinch-off voltage at the bottom of the channel, the sidewall spacing at the ends of the gate must be smaller than the bottom separation $x_d$. Control of this spacing differential is made difficult due to the variation in location of the island edge and the fact that there must be at least one mask alignment tolerance between the gate and the island edge.

One conventional solution to this problem is to use a gate that has a closed configuration with either the drain or the source contact contained within it, which necessitates running the conductor to the enclosed region over the gate junction. As a consequence, at a high voltage the conductor acts as a field plate, thereby reducing the breakdown voltage of the junction which it crosses.

SUMMARY OF THE INVENTION

In accordance with the present invention, reduction in island thickness so as to improve device performance without the need for additional processing steps is accomplished by controllably tailoring the shape or contour of the bottom of the island during anisotropic etching of the substrate, such that the resulting structure contains one or more projections whose separation from the topside diffusion predefines the operational characteristics of the device. In the case of anisotropically etching a (100) crystal surface of a silicon substrate to form a depression in which a dielectrically isolated island is to be formed, an inverted V-shaped projection, which stops on (111) crystal planes which are inclined at an angle on the order of 55° with respect to the (100) crystal surface, may be formed at the bottom of the depression using the same mask and etch step employed to form the isolation depression pattern. The height $H_p$ of the inverted V-shaped projection may be defined as:

$$H_p = \tfrac{1}{2}(W \tan 55°) \ldots \quad (2)$$

where W is the width of the etch pattern which defines the projection.

The mask width can be selected to provide any desired reduced channel thickness, given the thickness of the island and junction depth, which are set by component requirements. Mask location will determine whether the projection is located directly beneath the topside gate diffusion or adjacent to its curvilinear sidewalls.

Locating the projection directly beneath the bottom of the gate diffusion permits pinch-off voltage to be reduced without substantially affecting channel resistance. If desired saturation of the JFET drain characteristics at high drain voltage is not achieved by a single projection, two or more projections may be used.

Locating the projection so that its inclined surface extends alongside the curvilinear PN junction formed between the gate diffusion and the island allows both a reduction in channel thickness and sensitivity of channel thickness to variations in island thickness. To improve saturation, a second projection may be formed alongside an opposite edge of the gate diffusion.

In order to provide adequate breakdown performance, while eliminating the side channel at the ends of the gate diffusion, the topside gate diffusion may be formed by a low impurity concentration region which overlaps the dielectric sidewall boundaries of the island and a high impurity concentration region within the low impurity concentration region.

In addition to its use with DI isolated JFETs, the projection architecture of the present invention may be used to enhance BVCEO in DI island-resident bipolar structures. For this purpose, similar to the JFET device, during the formation of a depression in the substrate in which the bipolar transistor is to reside, the substrate is masked such that a portion of the substrate extends as an inverted V-shaped projection above the floor of the depression. After a dielectric isolation layer has been formed on the entirety of the surface of the depression, a semiconductor island of a first conductivity type (e.g. N-type), which is to serve as the collector region of the bipolar device, is formed on the dielectric layer, so as to be dielectrically isolated from the substrate. A first semiconductor region of a second conductivity type (e.g. P-type), opposite to the first conductivity type and serving as a base region of the bipolar device, is formed in the collector layer so as to define a base-collector PN junction, which has a relatively shallow portion above the vertex of the inverted V-shaped projection and a relatively deep portion which extends alongside but is spaced-apart from the inclined walls of the projection. A second semiconductor region of the first conductivity type, serving as an emitter region of the bipolar device, is formed in the first semiconductor region, so as to define a base-emitter PN junction which is separated from the projection by the island layer. Each of the island layer, the base region and the emitter region is coupled to receive a respective bias voltage. The base-collector PN junction is spaced-apart from the projection by a distance such that that portion of the island layer between the base-collector PN junction and the projection becomes completely depleted of carriers prior to the magnitude of the electric field required for collector-emitter breakdown being reached in the course of an increase in collector-to-emitter voltage. Preferably, the substrate is biased at a voltage the magnitude of which is less than that applied to the island layer (for an N-type island layer). For a P-type island layer, the substrate is biased at a voltage greater than that applied to the island layer.

At the bottom of the island layer a third, buried semiconductor region of the first conductivity type and having an impurity concentration greater than that of the island layer may be formed. The buried layer may extend over the entirety of the floor portion of the island layer or it may extend over only part of the island floor.

The bipolar structure may be modified to form a vertical JFET having a configuration that is structurally complementary to that described above. Specifically, as in the case of the above-described bipolar transistor, a dielectric layer is formed over the entirety of the depression from the bottom floor of which an inverted V-shaped projection extends. A semiconductor island layer, of a first conductivity type (e.g. N-type) which is to serve as the drain region of the device, is formed on the dielectric layer so as to be dielectrically isolated from the substrate. A first semiconductor region of a second conductivity type (e.g. P-type), serving as a gate region of the device, is formed in the island layer so as to define therewith a PN junction which extends alongside but is spaced-apart from the inverted V-shaped projection. A second semiconductor region of the first conductivity type, having an impurity concentration greater than that of the island layer and serving as a source region of the device, is formed in a portion of the island layer above the vertex of the projection of said substrate. The source region must be surrounded by (and may contact) the gate region. A third, semiconductor region of the first conductivity type and having an impurity concentration greater than that of the island layer, and serving as a drain contact region, is formed in a surface portion of the island layer spaced apart from the gate region. The island layer and the substrate are biased such that the magnitude of the bias voltage applied to the substrate is less than that applied to the island layer, for an N-type island layer. For a P-type island layer the magnitude of the substrate bias is greater than that applied to the island layer. The gate region is spaced apart from the inverted V-shaped projection by a distance such that that portion of the island layer which lies between the projection and the gate region forms an extended channel region of the JFET device.

In addition to supporting active devices, such as the above-described bipolar and JFET architectures, islands are often used as resistance devices. The resistance of such island devices can be increased and their saturation voltage decreased by forming one or more projections across the bottom of the island layer, which effectively increases the resistance at those portions of the island layer between the vertex of each projection and the top surface of the island layer. As in the above described embodiments, each of the one or more projections is configured as an inverted V-shaped projection. The island layer may also include an insulator layer overlying its top surface, with an electrode formed on the insulator layer, and biased at a voltage such that a depletion region is formed in an underlying portion of the island layer, so as to increase the resistance through the island layer between spaced apart ohmic contact semiconductor regions. The substrate may be coupled to receive a prescribed bias voltage for causing the formation of a depletion region in the island layer and thereby increase resistance of the island layer.

DETAILED DESCRIPTION

Figure 1:
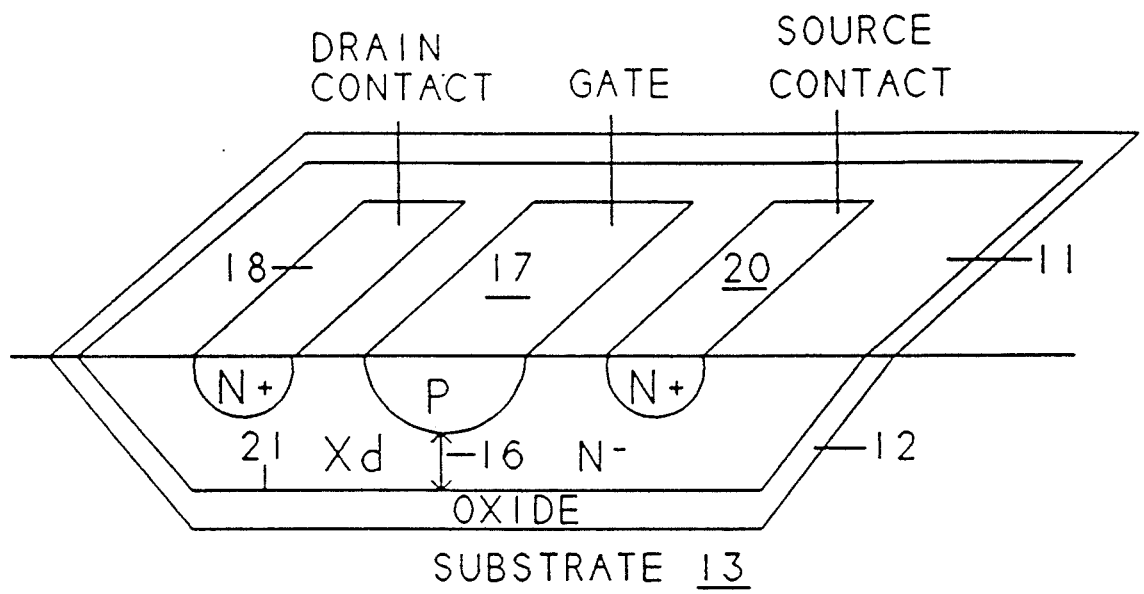
FIG. 1 diagrammatically illustrates a conventional JFET device architecture formed within a dielectrically isolated island.
Figure 2:
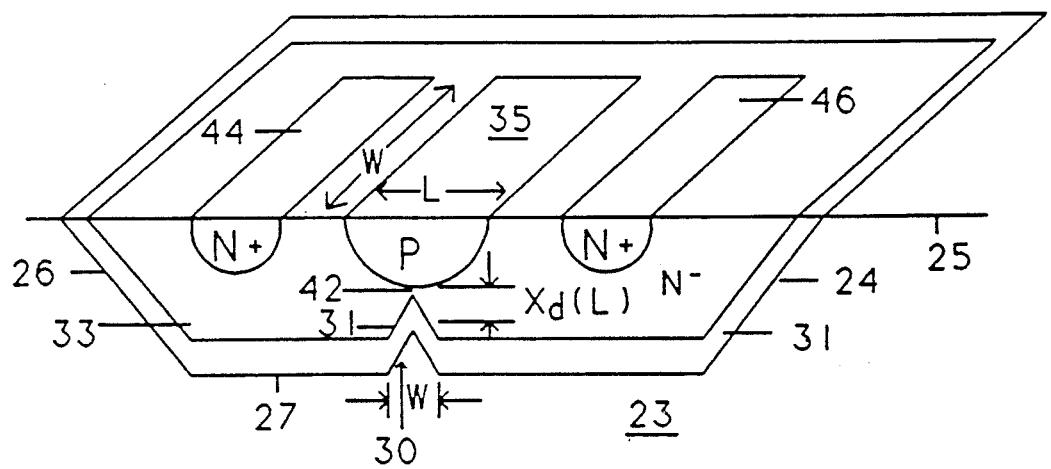
FIG. 2 diagrammatically illustrates an improved JFET structure formed in a dielectrically isolated island of an integrated circuit architecture in accordance with a first embodiment of the present invention.

Referring now to FIG. 2, an improved JFET structure formed in a dielectrically isolated island of an integrated circuit architecture in accordance with a first embodiment of the present invention is diagrammatically shown in an isometric cut-away view as comprising a semiconductor (e.g. silicon) substrate 23 having a depression 24 extending from a first (100) crystal surface 25 and having inclined or sloped sidewalls 26 that extend to a floor region 27, the surface of which is generally parallel to the (100) crystal surface. As mentioned previously, the mask through which substrate 23 is etched to form depression 24 is defined so that, as a semiconductor layer 11 is anisotropically etched from its (inverted) surface 27, one or more relatively shallow, V-shaped depressions and relatively deep V or trapezoidal depressions are formed in layer 11. When substrate material is formed over a dielectric layer that overlies the depression-contoured surface 27 of layer inverting the resulting structure yields the configuration shown in FIG. 2, in which substrate 23 has a complementary depression from the bottom of which a projection 30 extends into layer 11 from (underlying) substrate 23. Like sidewalls 26, projection 30 stops on (111) crystal planes which are inclined at an angle on the order of 55° with respect to the (100) crystal surface. The height $H_p$ of projection 30 is defined (as set forth in equation (2) above) in accordance with the angle of the (111) crystal plane and the width W of the etch pattern used to etch the projection. The mask width can be selected to provide any desired reduced channel thickness, given the thickness of the island and junction depth, which are set by component requirements.

In other words, as noted above, a dielectric layer 31 is formed on the entire surface of the etched layer 11, including both deep and shallow depressions. Semiconductor material is then formed over the surface of dielectric layer 31, so that it fills the depression 24 and one or more depressions which, when inverted, yield projection 30. Thus, the resulting structure, when inverted as illustrated in FIG. 2, may be characterized as a substrate 23 having a semiconductor island layer 33 of a first prescribed conductivity type (e.g. N-type), which fills depression 24 and is dielectrically isolated from substrate 23. Island layer 33 serves as the channel of the JFET. A semiconductor region 35 of a second conductivity type (e.g. P-type), which is to serve as the gate region of the device, is formed in a surface portion of the island layer above or overlying projection 30, so as to define with the island layer a PN junction 41 which extends adjacent to, but is spaced apart from projection 30 by a 'channel' region 42 of the island layer therebetween. High impurity concentration N+ source and drain contact regions 44 and 46 are formed in spaced-apart surface portions of the island layer on opposite sides of gate region 35.

A feature of the configuration shown in FIG. 2 is that the channel region 42 has a reduced thickness only in the region of the vertex 38 of the projection 30. The significance of this aspect of the embodiment of the invention is that channel resistance $R_on$ is inversely proportional to channel thickness $x_d$ and also directly proportional to channel length L. More specifically, $$R_o n = (1/qN_cu)(L/x_dW) \ldots \quad (3)$$

where u = channel carrier mobility.

For a non-uniform channel thickness, as in the case of the configuration of FIG. 2, the channel resistance $P_on$ is defined as:

$$R_{on} = (1/qN_cuW) \int_o^L dL/x_d(L) \quad (4)$$

The pinch-off voltage $V_p$ is set by the minimum value of $x_d$ in the channel. Consequently, it can be seen that the pinch-off voltage $V_p$ is reduced while $R_on$ is unchanged if the channel thickness is minimized only in a thin region.

If the drain characteristics of the JFET are to saturate at a high drain voltage, there is a limit to how short the channel length L can be, compared to channel thickness $x_d$. Where saturation is desired and a single projection is inadequate to provide it, two or more projections may be formed so as to underlie the gate region, as illustrated at 30-1 and 30-2 in FIG. 3.

Figure 3:
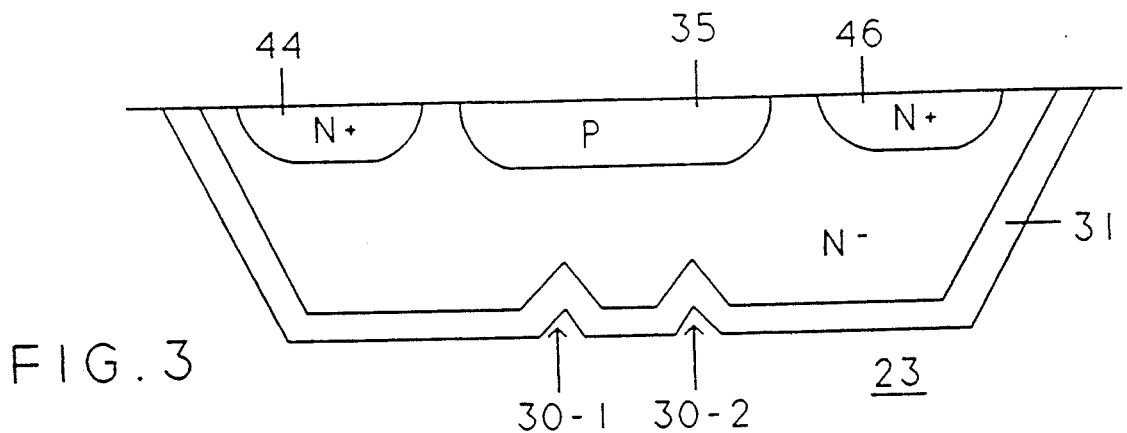
FIG. 3 shows a JFET structure having plurality of projections formed so as to underlie the gate region.
Figure 4:
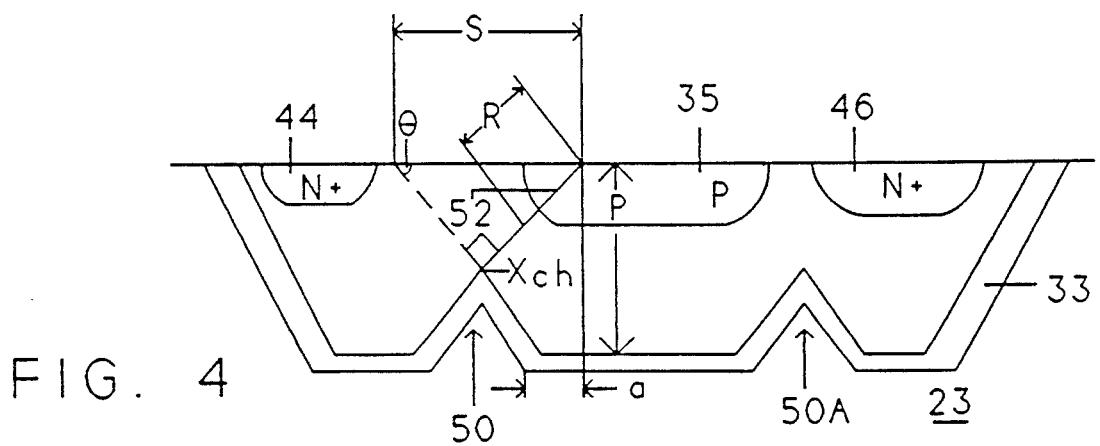
FIG. 4 shows a JFET structure in which an island projection has its inclined surface extends alongside the PN junction formed between the gate diffusion and the island layer.

Rather than locate the projection directly beneath the gate region in the manner shown in FIGS. 2 and 3, the projection may be defined such that its inclined surface extends alongside the (curvilinear) PN junction formed between the gate diffusion and the island layer as shown by projection 50 in FIG. 4. Such a configuration allows both a reduction in channel thickness and sensitivity of channel thickness to variations in island thickness. In this embodiment, the minimum channel thickness which sets the pinch-off voltage $V_p$ lies along a line running 52 from the mask edge which defines gate region 35 and is perpendicular to the inclined sidewall of the projection. The edge of gate diffusion (PN junction 41) is approximately cylindrical so that the channel thickness $x_ch$ may be trigonometrically defined, using the geometrical notations of FIG. 4, as:

$$x_{ch} = (a + d \cot \theta) \sin \theta - R \quad (5)$$

$$\partial x_{ch}/\partial d = \cot \theta \sin \theta = \frac{\text{change of channel thickness}}{\text{change of island thickness}} \quad (6)$$

Where the inclined surfaces of the projection are parallel to the (111) crystallographic plane and the top surface of the island layer lies in the (100) plane, so that $\theta = 55°$, then $\partial x_{ch}/\partial d = 0.58$, which translates to a reduced variation in channel thickness due to island thickness tolerance by more than 40%. To improve saturation, a second projection 50A may be formed alongside an opposite edge of the gate diffusion region 35. The incorporation of a second projection serves to reduce the variation in minimum channel length resulting from gate-to-isolation alignment by a factor of two, compared to a structure having a single projection along one side of the gate region.

The channel at the end of the gate region, namely facing the dielectric sidewall boundary of the island layer, can be eliminated by extending the gate region so that it overlaps the island sidewall. For this purpose the mask aperture through which the gate is defined may be extended beyond the widest allowable island edge. One suitable mechanism for this purpose is described in my U.S. Pat. No. 3,722,079.

Figure 5:
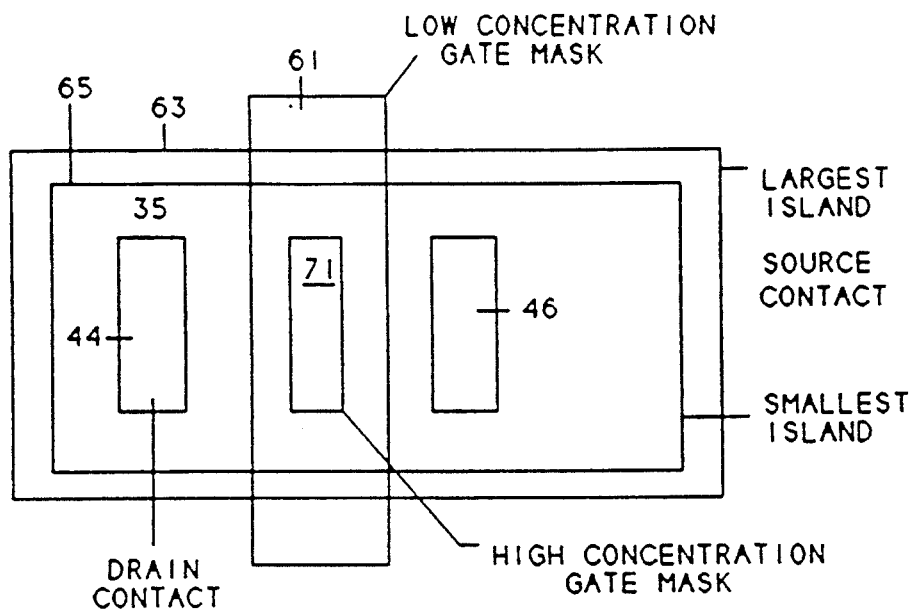
FIG. 5 shows a JFET structure in which the topside gate diffusion is formed of two regions.

In order to provide adequate breakdown performance, while eliminating the side channel at the ends of the gate diffusion, the topside gate diffusion may be formed of two regions in the manner illustrated in the top view of FIG. 5. As shown in the Figure, a low impurity concentration P region 61 overlaps dielectric sidewall boundaries 63, 65 of island 35. Region 61 can be depleted by the bias applied to the substrate. A high impurity concentration P+ region 71 is formed within low impurity concentration region 61 and spaced apart from sidewall boundaries 63, 65.

Figure 6:
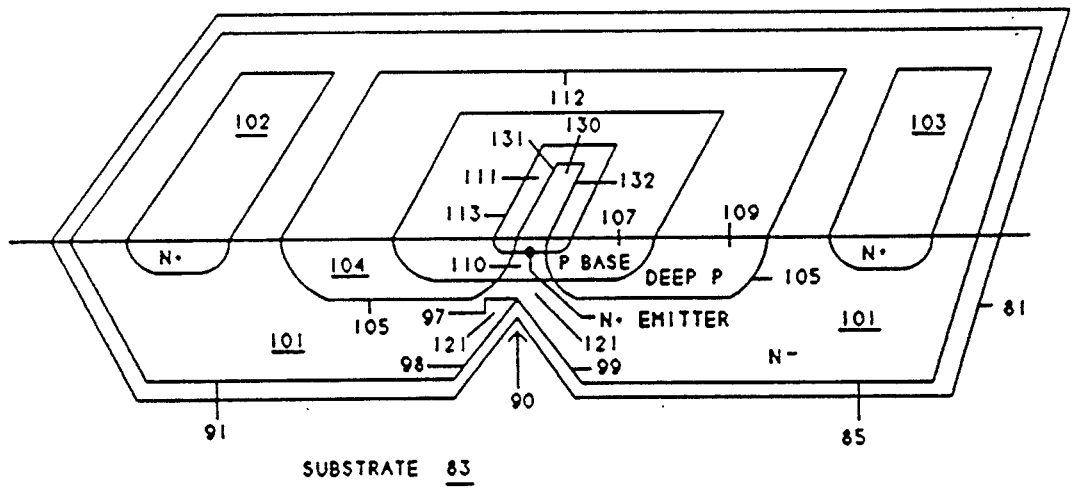
FIG. 6 shows the use of the bottom projection of the island layer to enhance BVCEO of a bipolar transistor structure.

FIG. 6 shows the use of the bottom projection of the island layer to enhance BVCEO of a bipolar transistor structure (e.g. NPN). The bipolar structure shown is one having a deep (P) base diffusion for the purpose of reducing the curvature of the base-collector PN junction to improve BVCBO. The island structure is similar to that of the JFET device, described above, in that, during the formation of an island depression 81, island 101 is masked such that a portion of the substrate extends as an inverted V-shaped projection 90 above floor 85 of the depression. After a dielectric isolation layer 91 has been formed on the surface of the depression, an N-type semiconductor island 101, which is to serve as the collector region, is formed on dielectric layer 91. N+ collector contact diffusions 102, 103 are formed in spaced apart portions of the top surface of island layer 101. A P-type base region 104 is formed in the collector island layer 101, so as to define a base-collector PN junction 105. Base region 104 is comprised of a relatively shallow portion 107 which extends above the vertex 97 of the inverted V-shaped projection 90, and a relatively deep portion 109, which extends alongside but is spaced-apart from the inclined walls 98, 99 of projection 90. An N-type emitter region 111 is formed in the shallow portion 107 and defines a base-emitter PN junction 113, which is separated from projection 90 by the semiconductor material of island layer 101. Each of island layer 101, base region 104 and emitter region 111 is coupled to receive a respective bias voltage (not shown).

The base-collector PN junction 105 is spaced-apart from projection 90 by a distance $x_d$, such that a narrow or reduced thickness portion 121 of island layer 101 between base-collector PN junction 105 and projection 90 becomes completely depleted of carriers prior to the magnitude of the electric field required for collector-emitter breakdown being reached in the course of an increase in collector-to-emitter voltage. Once reduced thickness portion 121 becomes totally depleted of carriers, the collector-to-emitter voltage can be increased up to the collector-base breakdown voltage, since the depletion region between the deep P portion 109 of the base region 104 and projection 90 effectively screens portion 110 of the base-collector junction directly beneath emitter region 111 (where BVCEO occurs) from the increased voltage. Namely, once total depletion is achieved, the electric field in the region of the collector-base junction beneath the emitter ceases to increase with an increase in collector voltage, thereby preventing the field from exceeding the field for BVCEO as collector voltage is increased.

Preferably, substrate 83 is biased at a voltage the magnitude of which (for an N collector island layer 101) is less than that applied to collector island layer 101, so as to assist in forming the desired depletion region. Biasing of the substrate may be achieved either by direct electrical contact to the substrate or by the action of leakage current balance and/or isolation capacitance division (in the case of a multi-island architecture with no direct contact to the substrate.

The ends of projection 90 in a direction normal to the plane of FIG. 6 preferably extend so that they are closer to the curvilinear sidewalls of the deep portion 109 (e.g. extending from edge 112 of base region 104) than inclined walls 98, 99 are to PN junction 105. This reduced spacing insures that the region of the N-collector adjacent the ends of the projection will deplete at a lower voltage than at regions 121. Thus the geometry along inclined wall portions 98, 99 establishes the voltage at which the depletion region forms a completely closed region, which separates that portion 122 of the N-collector region beneath the emitter region 111 from the N-collector island layer outside the projection.

Although, in the embodiment shown in FIG. 6, emitter region 111 overlaps the deep portion 109 of base region 104, region 111 may be of reduced width so that it lies entirely within a gap 130 defined by interior edges 131, 132 of deep base portion 109. Similarly, it is not necessary that there be a gap formed by interior edges of the deep base portion. The adjacent sides of the deep base portion may side diffuse until they overlap, so that the gap effectively disappears.

The embodiment shown in FIG. 6 may be modified by the addition of a high impurity concentration (N+) buried region 141 at the bottom of the island layer 101. As shown at 141 in FIG. 7, the buried layer may extend over the entirety of the floor portion of the island layer 101 or, as shown at 143 in FIG. 8, it may extend over only part of the island floor. In FIG. 8, the deep base portion to buried layer spacing is greater than that in the embodiment of FIG. 7 to achieve a corresponding breakdown voltage. In either case, the region 121 wherein the screening depletion region is formed is unchanged from that in the embodiment of FIG. 6.

Figure 7:
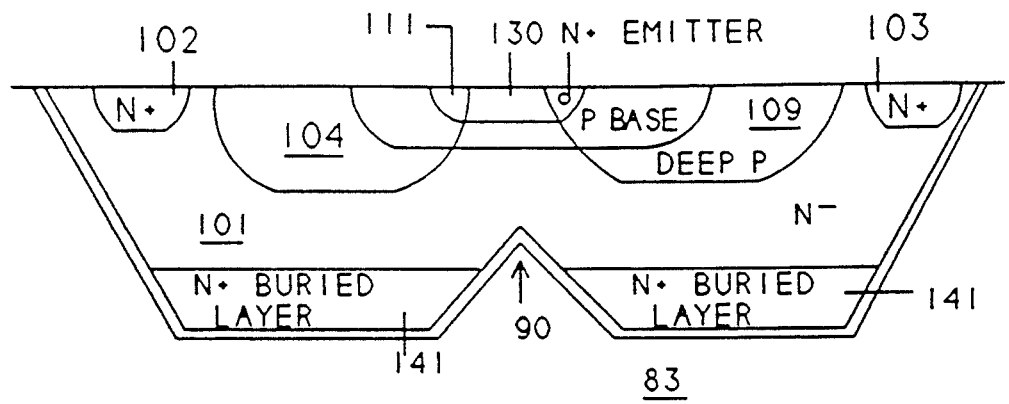
FIG. 7 shows a modification of the embodiment of FIG. 6 by the addition of a high impurity concentration buried region at the bottom of the island layer.
Figure 8:
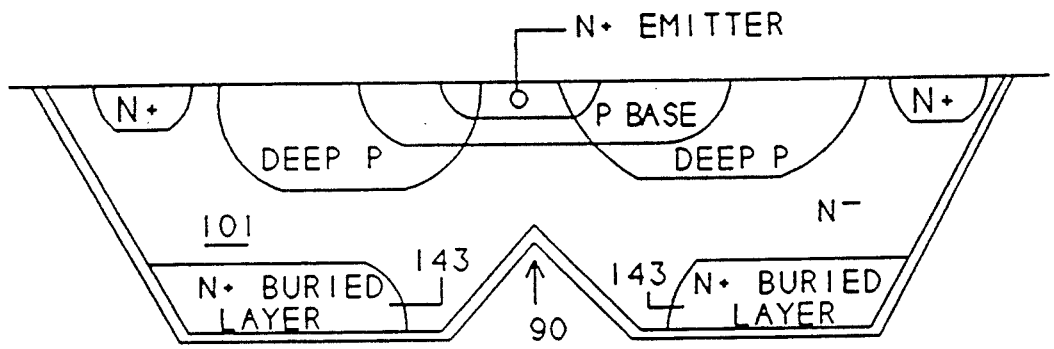
FIG. 8 shows a modification of the embodiment of FIGS. 6 in which a high impurity concentration buried region extends over part of the island floor.

Bipolar transistor devices employing the shallow base, narrow basewidth profiles of the embodiments of FIGS. 6-8 (using a two micron deep NPN profile) have demonstrated a considerably improved BVCEO (on the order of 220 V) over that (on the order of 70 V) of devices without the underlying base projection. (Similar breakdown performance will result from the use of a one micron base and emitter profile into the same deep P and island (N conductivity, four ohm-cm) structure.)

The high breakdown, low substrate resistivity characteristics of the projection-containing structure are also useful for producing devices which operate in high temperature environments. A major limitation on high temperature operation of a bipolar transistor is the temperature at which the collector goes intrinsic as a result of thermal carrier generation, which typically occurs at about 300° C. on 4 ohm-cm silicon. As the present invention is able to operate above this temperature, the improvement in maximum BVCEO for an NPN transistor is from about 50 V to about 200 V.

Figure 9:
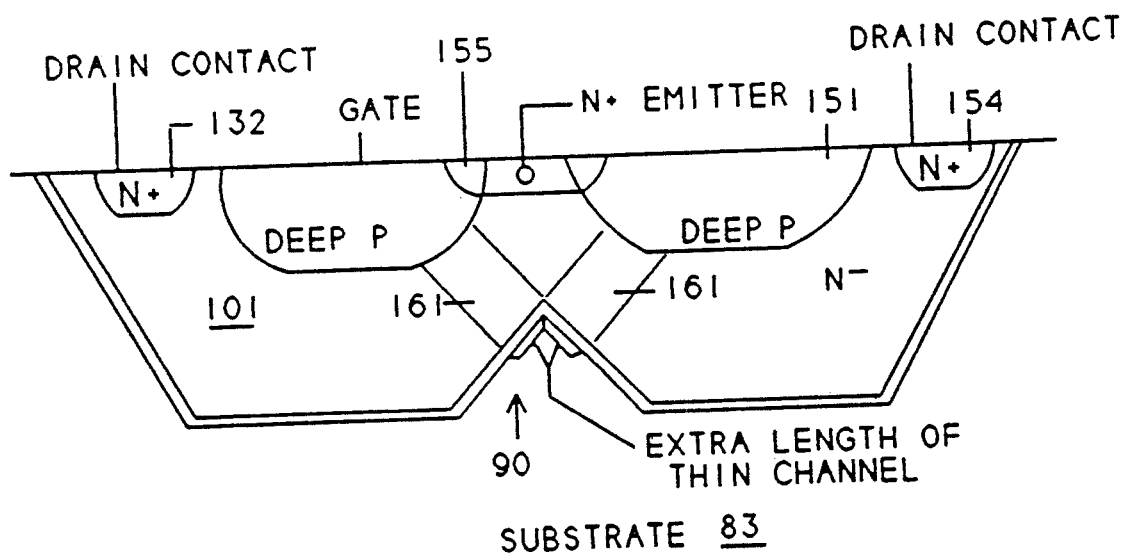
FIG. 9 shows a vertical JFET having a deep gate region which extends alongside but is spaced-apart from an inverted V-shaped projection.

The NPN bipolar structure of FIGS. 6-8 may be modified to form a vertical JFET having a configuration that is structurally complementary to that described above. Specifically, as shown in FIG. 9, within N-type island layer 101, which serves as the drain region of the JFET, a deep P-type gate region 151, configured like deep P base region 109 (FIG. 6), defines a PN junction 153 which extends alongside but is spaced-apart from the inverted V-shaped projection 90. A N+ region 155 which serves as a source region of the device, is formed in the surface portion of island layer 101 above vertex 97 of projection 90 and may optionally overlap gate region 151. N+ drain contact regions 152, 154 are formed in a surface portion of island layer 101 spaced apart from gate region 151. Island layer 101 and substrate 83 are biased such that, for an N-type island layer, the magnitude of the bias voltage applied to the substrate is less than that applied to the island layer. Gate region 151 is spaced apart from the inverted V-shaped projection by a distance such that that portion 161 of the island layer 101 which lies between projection 90 and gate region 151 forms an extended channel region of the JFET device.

A conventional vertical JFET structure without the projection of the present invention has a triode type characteristic since the ratio of channel length to channel thickness is too small for full saturation. The addition of projection 90 in accordance with the present invention provides the thin channel extensions 161 in series with the thin channel beneath the N+ source between opposite sides of the deep P gate region 151 to result in a fully saturated device.

Figure 10:
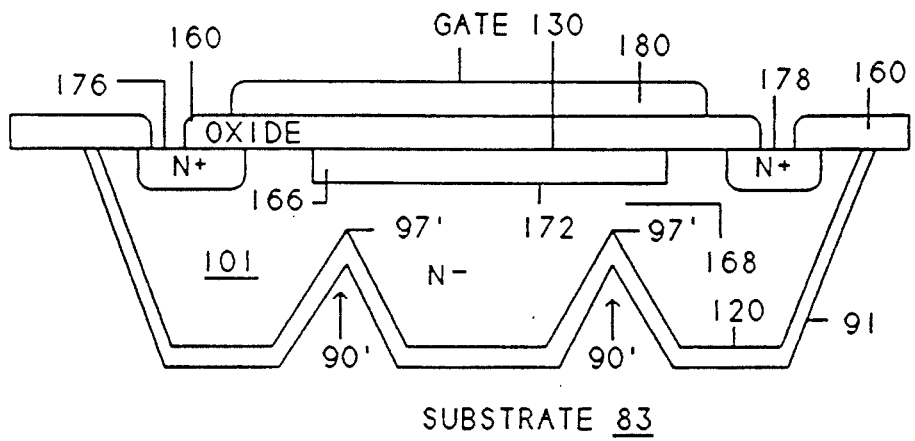
FIG. 10 shows an island resistance having a plurality of projections extending from its bottom surface toward a top surface.

In addition to supporting active devices, such as the above-described bipolar and JFET architectures, islands are often used as resistance devices. The resistance of such island devices can be increased and their saturation voltage decreased by forming one or more projections across the bottom of the island layer, which effectively increases the resistance at those portions of the island layer between the vertex of each projection and the top surface of the island layer. As diagrammatically illustrated in FIG. 10, island layer 101 may have one or more inverted V-shaped projections 90' extending from its bottom surface 120 toward a top surface 130 on which an insulator layer 160 is formed. Because of the projections 90', the resistance is increased within thin regions 168 between the vertices 97' of the projections 90' and the island surface 130. The overall resistance of the island layer is the sum of the resistances of each of the 'segments' between a pair of N+ ohmic contact regions 176, 178. The high resistance of the regions above projections 90' increases the resistance beyond that of an island resistor without the projections.

An electrode layer 180 may be formed on insulator layer 160, and coupled to receive at bias voltage such that a depletion region is formed in an underlying portion 172 of the island layer, so as to increase the resistance through the island layer between spaced-apart ohmic contact regions 176, 178. Substrate 83 may be similarly coupled to receive a prescribed bias voltage for causing the formation of a depletion region in the island layer and thereby increase resistance of the island layer.

As will be appreciated from the foregoing description, the present invention provides a mechanism for effectively reducing the thickness of a DI island structure and improving the performance of bipolar and JFET structures, without the need for additional processing steps, by controllably tailoring the shape or contour of the bottom of the island during anisotropic etching of the substrate, such that the resulting structure contains one or more projections whose separation from the topside diffusion predefines the operational characteristics of the device.

Positioning the projection directly beneath the bottom of a gate diffusion permits pinch-off voltage to be reduced without affecting channel resistance. When the projection is positioned so that its inclined surface extends alongside the curvilinear PN junction formed between the gate diffusion and the island, both a reduction in channel thickness and sensitivity of channel thickness to variations in island thickness is obtainable.

To enhance BVCEO in DI island-resident bipolar structures, the inverted V-shaped projection extends alongside, but is spaced-apart from, a deep base diffusion, so that the base-collector PN junction is spaced-apart from the projection by a distance such that that portion of the island layer between the base-collector PN junction and the projection becomes completely depleted of carriers prior to the magnitude of the electric field required for collector-emitter breakdown being reached in the course of an increase in collector-to-emitter voltage.

The resistance of an island resistance device can be increased by forming one or more projections across the bottom of the island layer, which effectively increases the resistance at those portions of the island layer between the vertex of each projection and the top surface of the island layer.

Although the above described embodiments employ an N-type island, all conductivity types may be reversed, so as to form PNP bipolar transistor devices and P-type JFET structures. (For P-type island structures the substrate bias is made more positive than the collector or drain.)

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed is:

1. A semiconductor device comprising:
   a substrate having a first surface and a depression extending from said first surface to a floor portion of said depression, said floor portion being configured such that at least one portion of said substrate extends above said floor portion of said depression in the form of at least one projection;
   a dielectric layer formed on the side surfaces and floor portion of said depression;
   a semiconductor layer of a first conductivity type and a first, relatively low, impurity concentration formed in contact with said dielectric layer in said depression, so as to be dielectrically isolated from said substrate;
   a first semiconductor region of a second conductivity type, opposite to said first conductivity type, formed in a first surface portion of said semiconductor layer so as to define therewith a PN junction which extends adjacent to, but is spaced apart from said at least one projection of said substrate by material of said semiconductor layer therebetween;

a second semiconductor region of said first conductivity type formed in a second surface portion of said semiconductor layer, spaced apart from said first surface portion thereof and having a second, relatively high, impurity concentration; and wherein, throughout that portion of said semiconductor layer which extends from said at least one projection to said PN junction, said semiconductor layer has said first, relatively low, impurity concentration, and wherein said at least one projection comprises a plurality of projections having sidewall portions which are disposed adjacent to and alongside first semiconductor region.

2. A semiconductor device comprising:

a substrate having a first surface and a depression extending from said first surface, said depression having side surfaces extending from said first surface to a floor portion of said depression, said floor portion being configured such that at least one portion of said substrate extends above said floor portion of said depression in the form of at least one projection;

a dielectric layer formed on the side surfaces and floor portion of said depression;

a semiconductor layer of a first conductivity type and a first, relatively low, impurity concentration formed in contact with said dielectric layer in said depression, so as to be dielectrically isolated from said substrate;

a first semiconductor region of a second conductivity type, opposite to said first conductivity type, formed in a first surface portion of said semiconductor layer so as to define therewith a PN junction which extends adjacent to, but is spaced apart from said at least one projection of said substrate by material of said semiconductor layer therebetween;

a second semiconductor region of said first conductivity type formed in a second surface portion of said semiconductor layer, spaced apart from said first surface portion thereof and having a second, relatively high, impurity concentration; and wherein, throughout that portion of said semiconductor layer which extends from said at least one projection to said PN junction, said semiconductor layer has said first, relatively low, impurity concentration, and wherein said at least one projection is configured as an inverted V-shaped projection having an inclined surface which extends adjacent to and alongside said PN junction.

3. A junction field effect transistor device comprising:

a substrate having a first surface and a depression extending from said first surface, said depression having side surfaces extending from said first surface to a floor portion of said depression, said floor portion being configured such that at least one portion of said substrate extends above said floor portion of said depression in the form of at least one projection;

a dielectric layer formed on the side surfaces and floor portion of said depression;

a semiconductor channel layer of a first conductivity type and a first, relatively low, impurity concentration formed in contact with said dielectric layer in said depression, so as to be dielectrically isolated from said substrate;

a semiconductor gate region of a second conductivity type, opposite to said first conductivity type, formed in a first surface portion of said channel layer so as to define therewith a PN junction which extends adjacent to, but is spaced apart from said at least one projection of said substrate by material of said semiconductor channel layer therebetween; and source and drain contact regions formed in spaced-apart surface portions of said semiconductor channel layer on opposite sides of said gate region and having a second, relatively high, impurity concentration; and wherein, throughout that portion of said semiconductor channel layer which extends from said at least one projection to said PN junction, said semiconductor channel layer has said first, relatively low, impurity concentration, and wherein said at least one projection comprises first and second projections disposed adjacent to and alongside said gate region.

4. A junction field effect transistor device according to claim 3, wherein the thickness of that portion of said semiconductor channel layer beneath the bottom of said gate region is less than the height of said first and second projections above the floor portion of said depression.

5. A junction field effect transistor device according to claim 3, wherein said first surface of said substrate is a (100) crystal surface and said first and second projections are configured as inverted V-shaped projections which are inclined at an angle on the order of 55° with respect to said (100) crystal surface, such that inclined surfaces of said first and second projections are disposed adjacent to and alongside said gate region.

6. A junction field effect transistor device according to claim 3, wherein said gate region intersects a dielectric sidewall boundary of said semiconductor layer and further including a high impurity concentration semiconductor region having an impurity concentration higher than that of said gate region, and being disposed in said gate region so as to be spaced apart from said dielectric sidewall boundary by semiconductor material of said gate region therebetween.

7. A bipolar transistor device comprising:

a substrate having a first surface and a depression extending from said first surface, said depression having side surfaces extending from said first surface to a floor portion of said depression, said floor portion being configured such that at least one portion of said substrate extends above said floor portion of said depression in the form of at least one projection;

a dielectric layer formed on the side surfaces and floor portion of said depression;

a semiconductor layer of a first conductivity type and a first, relatively low, impurity concentration formed in contact with said dielectric layer in said depression, so as to be dielectrically isolated from said substrate, said semiconductor layer serving as a collector region of said bipolar transistor device;

a first semiconductor region of a second conductivity type, opposite to said first conductivity type, formed in a first surface portion of said semiconductor layer so as to define therewith a base-collector PN junction which extends adjacent to and alongside, but is spaced apart from said at least one projection of said substrate by material of said semiconductor layer therebetween, said first semiconductor region serving as a base region of said bipolar transistor device;

a second semiconductor region of said first conductivity type, serving as an emitter region of said bipolar transistor device, formed in said first semiconductor region, so as to define therewith a base-emitter PN junction which is separated from said projection material of said first semiconductor layer therebetween; and wherein, throughout that portion of said semiconductor layer which extends from said at least one projection to said base-collector PN junction, said semiconductor layer has said first, relatively low, impurity concentration.

8. A bipolar transistor device according to claim 7, wherein said semiconductor layer is of N-type conductivity and said substrate is biased at a first bias voltage less than a second bias voltage coupled to said semiconductor layer.

9. A semiconductor device according to claim 7, wherein said semiconductor layer is of P-type conductivity and said substrate is biased at a first bias voltage greater than a second bias voltage coupled to said semiconductor layer.

10. A bipolar transistor device according to claim 7, further including a buried third semiconductor region of said first conductivity type and said second, relatively high impurity concentration, formed in that portion of said semiconductor layer which is adjacent to the floor portion of said depression.

11. A bipolar transistor device according to claim 10, wherein said third semiconductor region extends over the entirety of the floor portion of said depression.

12. A bipolar transistor device according to claim 10, wherein said third semiconductor region extends over only part of the floor portion of said depression.

13. A bipolar transistor device according to claim 7, wherein said projection is configured as an inverted V-shaped projection, and wherein said base region includes a first portion and a second portion, the depth of which second portion in said semiconductor layer exceeds that of said first portion and extends alongside an inclined region of said inverted V-shaped projection, and wherein said inverted V-shaped projection has a vertex located beneath said first portion of said base region.

14. A junction field effect transistor device comprising:

a substrate having a first surface and a depression extending from said first surface, said depression having side surfaces extending from said first surface to a floor portion of said depression, said floor portion being configured such that at least one portion of said substrate extends above said floor portion of said depression in the form of at least one projection;

a dielectric layer formed on the side surfaces and floor portion of said depression;

a semiconductor layer of a first conductivity type and a first, relatively low, impurity concentration formed in contact with said dielectric layer in said depression, so as to be dielectrically isolated from said substrate, said semiconductor layer serving as a drain region of said device;

a first semiconductor region of a second conductivity type, opposite to said first conductivity type, formed in a first surface portion of said semiconductor layer so as to define therewith a PN junction which extends alongside, but is spaced apart from said at least one projection of said substrate by material of said semiconductor layer therebetween, said first semiconductor region serving as a gate region of said device; a second semiconductor region of said first conductivity type formed in a second surface portion of said semiconductor layer, spaced apart from said first surface portion thereof and having a second, relatively high, impurity concentration, said second semiconductor region serving as a drain contact for said device;

a third semiconductor region of said first conductivity type, and having said second, relatively high impurity concentration, and serving as a source region of said device, formed in a portion of said first semiconductor layer above a vertex of said projection of said substrate; and wherein said gate region is spaced-apart from said projection by a distance such that that portion of said semiconductor layer which lies between said projection and said gate region forms an extended channel region of said device and, throughout that portion of said semiconductor layer which extends from said at least one projection to said PN junction, said semiconductor layer has said first, relatively low, impurity concentration.

15. A device according to claim 14, wherein said semiconductor layer is of N-type conductivity and said substrate is biased at a first bias voltage less than a second bias voltage that is coupled to said semiconductor layer.

16. A device according to claim 14, wherein said semiconductor layer is of P-type conductivity and said substrate is biased at a first bias voltage greater than a second bias voltage that is coupled to said semiconductor layer.

17. A device according to claim 14, wherein said projection is configured as an inverted V-shaped projection having a vertex located beneath a bottom portion of said second semiconductor region.

18. A semiconductor device comprising:

a semiconductor substrate having a first surface and a depression which extends from said first surface to a bottom floor portion thereof, said depression having side surfaces extending from said first surface to said floor portion of said depression, said floor portion being configured such that a portion of said substrate extends above said floor portion of said depression in the form of a projection;

a dielectric layer formed on the side surfaces, the floor portion of said depression and said projection;

a lightly doped semiconductor layer of a first conductivity type formed in contact with said dielectric layer in said depression, so as to be dielectrically isolated from said substrate;

a first semiconductor region of a second conductivity type, opposite to said first conductivity type, formed in a first surface portion of said semiconductor layer so as to define therewith a PN junction which extends alongside, but is spaced apart from said projection of said substrate by lightly doped semiconductor material which extends from said at least one projection to said PN junction; and a second, heavily doped semiconductor region of said first conductivity type formed in a second surface portion of said semiconductor layer, spaced apart from said first surface portion thereof.

19. A semiconductor device according to claim 18, wherein said projection is configured as an inverted V-shaped projection.

20. A semiconductor device according to claim 18, further comprising a third, heavily doped semiconductor region of said first conductivity type, formed in a third surface portion of said lightly doped semiconductor layer and spaced apart from said first surface portion of said lightly doped semiconductor layer.

21. A semiconductor device according to claim 18, wherein said first semiconductor region is formed in said lightly doped semiconductor layer so as to overlie a vertex portion of said projection.

22. A semiconductor device according to claim 18, wherein said projection is configured as an inverted V-shaped projection having a vertex located beneath a bottom portion of said first semiconductor region.

23. A semiconductor device according to claim 18, wherein said projection is configured as an inverted V-shaped projection having an inclined surface which extends adjacent to and alongside said PN junction.

24. A semiconductor device according to claim 18, wherein said first semiconductor region intersects a dielectric sidewall boundary of said lightly doped semiconductor layer and further including a third, heavily doped semiconductor region of said second conductivity type, and being disposed in said first semiconductor region so as to be spaced apart from said dielectric sidewall boundary by semiconductor material of said first semiconductor region therebetween.

25. A semiconductor device according to claim 18, wherein said first conductivity type is N type and said second conductivity type is P type, said substrate is biased at a first bias voltage, said lightly doped semiconductor layer is biased at a second bias voltage, greater than said first bias voltage, and said first semiconductor region is biased at a third bias voltage such that said PN junction is reverse-biased, thereby causing a depletion region to extend therefrom into the first, relatively low, impurity concentration material of said semiconductor layer between said PN junction and said at least one projection.

* * * * *